US008175131B2

(12) United States Patent
Kirby et al.

(10) Patent No.: US 8,175,131 B2
(45) Date of Patent: *May 8, 2012

(54) LASER MEDIA WITH CONTROLLED CONCENTRATION PROFILE OF ACTIVE LASER IONS AND METHOD OF MAKING THE SAME

(75) Inventors: Kevin W. Kirby, Calabasas Hills, CA (US); David S. Sumida, Los Angeles, CA (US)

(73) Assignee: Raytheon Company, Waltham, MA (US)

( * ) Notice: Subject to any disclaimer, the term of this patent is extended or adjusted under 35 U.S.C. 154(b) by 368 days.

This patent is subject to a terminal disclaimer.

(21) Appl. No.: 12/397,082

(22) Filed: Mar. 3, 2009

(65) Prior Publication Data

US 2010/0226407 A1 Sep. 9, 2010

(51) Int. Cl.
*H01S 3/14* (2006.01)

(52) U.S. Cl. ........... 372/68; 372/43.01; 372/70; 438/45; 438/542; 438/549; 257/E21.002; 257/E21.466

(58) Field of Classification Search ............... 372/43.01, 372/68, 70; 438/45, 542, 549; 257/E21.002, 257/E21.466
See application file for complete search history.

(56) References Cited

U.S. PATENT DOCUMENTS

| 6,813,286 | B1 * | 11/2004 | Danziger et al. | 372/19 |
| 6,996,137 | B2 * | 2/2006 | Byren et al. | 372/10 |
| 7,535,947 | B2 * | 5/2009 | Sumida et al. | 372/68 |
| 2004/0028101 | A1 * | 2/2004 | Byren et al. | 372/39 |
| 2007/0242714 | A1 * | 10/2007 | Sumida et al. | 372/40 |

FOREIGN PATENT DOCUMENTS

| WO | 03/088432 A2 | 10/2003 |
| WO | 2007/120432 A2 | 10/2007 |

OTHER PUBLICATIONS

R.D. Shannon, "Revised effective ionic radii and systematic studies of interatomic distances in halides and chalcogenides"; Acta Crystallographica—Section A: Crystal Physics, Diffraction, Theoretical and General Crystallography; 1976; pp. 751-767; vol. 32, Issue 5.

* cited by examiner

*Primary Examiner* — Jessica Stultz
*Assistant Examiner* — Yuanda Zhang

(57) ABSTRACT

A laser medium comprises a solid-state host material and dopant species provided within the solid-state host material. A first portion of the dopant species has a first valence state, and a second portion of the dopant species has a second valence state. In an embodiment, a concentration of the first portion of the dopant species decreases radially with increasing distance from a center of the medium, and a concentration of the second portion of the dopant species increases radially with increasing distance from the center of the medium. The laser medium further comprises impurities within the solid-state host material, the impurities converting the first portion of the dopant species having the first valence state into the second portion of dopant species having the second valence state.

21 Claims, 4 Drawing Sheets

LASER MEDIA WITH CONTROLLED CONCENTRATION PROFILE OF ACTIVE LASER IONS AND METHOD OF MAKING THE SAME

BACKGROUND

This disclosure pertains to laser media, and particularly to laser media with controlled concentration profile of active laser ions and a method of making such a controlled concentration profile.

Solid-state lasers are used in many applications and are known to provide high output power levels which can be desirable in certain applications. Some of these applications also require short duration pulses, which may fall into the nanosecond range. In general, solid state lasers include a doped lasing medium. The lasing medium is provided inside a laser cavity and can be selected from many shapes such as cylindrical rods, rectangular slabs, discs, etc.

A laser can operate at various transverse electromagnetic (TEM) modes (e.g., $TEM_{00}$, $TEM_{01}$, $TEM_{10}$, $TEM_{11}$, $TEM_{20}$, $TEM_{02}$, $TEM_{12}$, $TEM_{21}$, $TEM_{22}$, etc.), depending upon the geometry of the cavity of the laser and the gain medium, i.e., the lasing medium. When a laser operates in several transverse modes, i.e., multimode, the total intensity profile of the laser beam is a superposition of the intensity profiles of all existing transverse modes. Multimode operation can provide the maximum overall intensity. Multimode operation may be desirable if high output power is wanted. Multimode operation can, however, affect the spatial coherence of the laser and can cause "hot spots" within the lasing medium where the modes interfere to create energy overlap. These "hot spots" can lead to optical damage or they may change the mode supported by the laser cavity to an unstable output. Therefore, in some circumstances, it may be desirable to operate in a limited number of transverse modes or in a single transverse mode such as in the fundamental $TEM_{00}$ mode. In addition, operating in a low order TEM modes can produce an output laser beam that has limited divergence while providing a relatively high brightness.

One conventional technique that has been used to limit the number of transverse modes or discriminate against higher-order modes is to provide an aperture inside the laser cavity. The aperture has the effect of blocking higher order modes having a larger spatial extent. In effect, only the Gaussian peak of the $TEM_{00}$ fundamental transverse mode is allowed to pass through the aperture. One price to pay for a "cleaner" fundamental transverse mode $TEM_{00}$ is lower power because the radiation beam inside the active laser medium interacts with less of a population inversion. Another conventional technique in reducing the number of transverse modes or discriminating against higher-order transverse modes is by varying the reflectivity of the output coupler mirror across the transverse dimension. Other structures in the lasing cavity can be used to correct beam quality as well. A Gaussian reflector can be used to reduce higher order TEM modes of the beam. However, incorporating an optical aperture or other structures in the laser cavity adds complexity, cost, and additional optical surfaces that may be susceptible to optical damage.

Instead of incorporating an optical aperture or other structures into the laser cavity, another conventional method decreases a concentration of laser active ions near the surface region of the laser medium by converting the laser active ions into laser inactive ions. The conversion of laser active ions into laser inactive ions is performed in a reducing environment at relatively high temperature by removing oxygen ions from the laser medium initially containing oxygen ions. The removal of oxygen ions results in a valence reduction of active laser ions in the same surface region which changes the laser active ions of one valence state into laser inactive ions of another valence state. The conversion of the laser active ions into laser inactive ions is driven by diffusion of oxygen vacancies. However, due to the slow diffusion rate of the oxygen vacancies, the process affects only a small portion of the laser active ions near the surface of the laser medium. Calculations show that at process temperatures near the melting point of the laser medium, a time period greater than 10 days is required to affect 50% of the laser active ions in a layer of less than 0.1 mm in thickness from the surface of the laser medium. As a result, a conversion of the active laser ions to inactive laser ions confined to near the surface of the laser medium provides only limited discrimination against higher-order transverse modes.

Therefore, there is a need in the art for a laser that can produce uniform high intensity beam quality without incorporating an optical aperture or other structures into the laser cavity or in the case of the laser medium without being limited to a conversion of the active laser ions to inactive laser ions to only near the surface of the laser medium.

SUMMARY

An embodiment of the present disclosure provides a method of manufacturing a laser medium with controlled concentration profile of active laser ions in which a laser medium comprising a solid-state host material and dopant species within the solid-state host material is provided, the dopant species including active laser ions having a first valence state; and adding impurities into the solid-state host material of the laser medium to change a concentration profile of the active laser ions within the solid-state host material along a radial direction of the laser medium. The impurities convert a portion of the active laser ions having the first valence state to inactive laser ions having a second valence state.

Another embodiment provides a laser medium comprising a solid-state host material and dopant species provided within the solid-state host material. A first portion of the dopant species has a first valence state, and a second portion of the dopant species has a second valence state. A concentration of the first portion of the dopant species decreases radially with increasing distance from a center of the medium, and a concentration of the second portion of the dopant species increases radially with increasing distance from the center of the medium. The laser medium further comprises impurities within the solid-state host material, the impurities converting the first portion of the dopant species having the first valence state into the second portion of dopant species having the second valence state.

These and other features and characteristics of the present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. In one embodiment of this disclosure, the structural components illustrated herein are drawn to scale. It is to be expressly understood, however, that the drawings are for the purpose of illustration and description only and are not intended as a definition of the limits of the inventive concept. As used in the specification and in the claims, the singular form of "a", "an", and "the" include plural referents unless the context clearly dictates otherwise.

DETAILED DESCRIPTION

Figure 1:
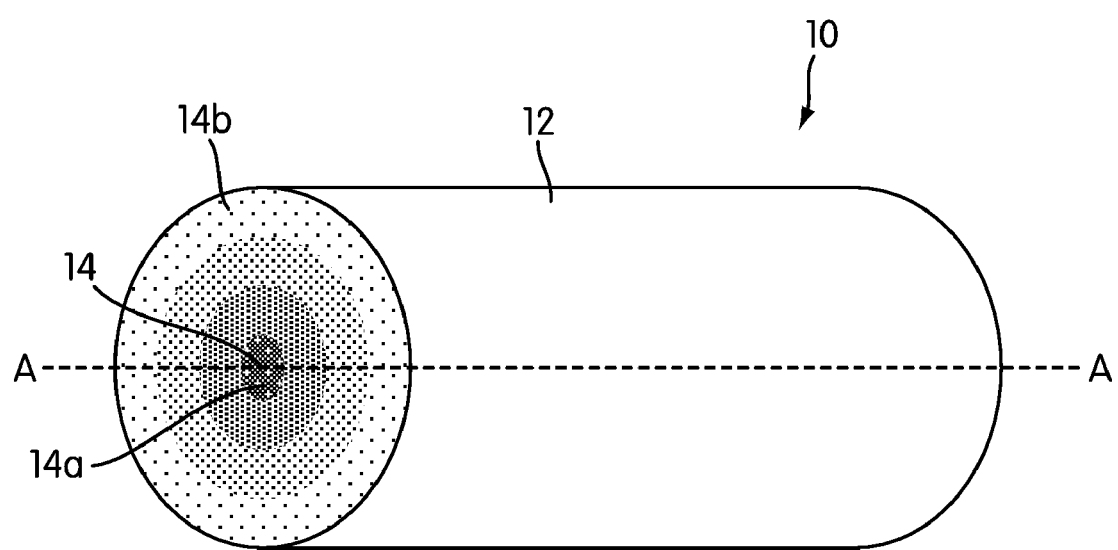
FIG. 1 is a schematic representation of a laser medium, according to an embodiment.

FIG. 1 is a schematic perspective three dimensional view of a lasing gain medium of a solid-state laser fabricated according to an embodiment. The lasing gain medium 10 includes a solid-state host material 12 which contains dopant species 14 at a first valence state 14a, and the same dopant species at a second valence state 14b. The concentration profile of the dopant species 14 in the first valence state 14a decreases radially with increasing distance from a center of the lasing medium and the concentration profile of the dopant species 14 at the second valence state 14b increases radially with increasing distance from a center of the lasing medium. In one embodiment, at the periphery of solid host material 12, substantially all the dopant species 14 are in the second valence state, whereas around the center or around the longitudinal axis AA of solid host material 12, substantially all the dopant species 14 are in the first valence state 14a. Although laser medium 10 is depicted in FIG. 1 as having a cylindrical shape with a round cross-sectional base, laser medium 10 or solid host material 12 can have any other suitable shape such as, a cylindrical shape with a polygonal base (e.g., triangular base, a square base, a rectangular base, an octagonal base, an hexagonal base, etc.), a cylindrical shape with an elliptic base, or a disc shape in which the longitudinal dimension of the laser medium is smaller than the transverse dimension of the laser medium.

Solid state host material or host matrix 12 can be yttrium aluminum garnet $Y_3Al_5O_{12}$ (YAG), yttrium lithium fluoride (YLF), yttrium vanadate ($YVO_4$), yttrium orthosilicate ($Y_2SiO_5$), or a sapphire (aluminum oxide).

Similarly, there are numerous dopant species 14 that can be incorporated into host material 12, including ytterbium, erbium, cerium, praseodymium, neodymium, terbium, dysprosium, thulium, samarium, europium, uranium, vanadium, chromium, cobalt, nickel, titanium, iron, manganese, or any combination of two or more thereof.

For example, Nd:YAG, Yb:YAG, Ti:Sapphire, Cr:Sapphire, or Er:YLF lasing materials can be fabricated. In the case of Yb:YAG, the trivalent ytterbium ions ($Yb^{3+}$) absorb a pump radiation from 940 nm or 980 nm to emit laser radiation through a multiple pass in the cavity at a wavelength centered around about 1030 nm.

In one embodiment, the lasing medium with the above concentration profiles of the dopant species in the first and second valence states can be fabricated by adding impurities into the host material comprising dopant species 14 in first valence state 14a so as to convert a portion of dopant species 14 in first valence state 14a to dopant species 14 in second valence state 14b. For example, in one embodiment, the lasing medium with the above concentration profiles of the dopant species in the first and second valence states can be fabricated by exposing the solid host material which is initially uniformly doped with dopant species 14 in first valence state 14a to water vapor at relatively high temperature for a period of time to form hydroxyl ions $OH^-$ within host material 12 so as to change the valence state of dopant species 14 from first valence state 14a to second valence state 14b. The temperature and/or the period of time of heat exposure can be selected to control the profile of the distribution of the dopants at the first and second valence states in the transverse direction as a function of radial distance from the center of the lasing medium.

Dopant species 14 with first valence state 14a can be excited by incident pump photons to induce lasing and are laser active, i.e., exhibit appropriate absorption and emission cross-sections consistent with laser operation. On the other hand, dopant species 14 with second valence state 14b are not laser active as the absorption and emission cross-sections characteristics are not adequate to sustain a lasing operation.

Table 1 lists examples of solid-state dopant species 14 that can exist in more than one valence state within a host material based on Shannon (R. D. Shannon, "Revised Effective Ionic Radii and Systematic Studies of Interatomic Distances in Halides and Chalcogenides," Acta Cryst. A32, pp. 751-767 (1976)). Table 1 lists the lasing valence state and the non-lasing valence state(s) for each dopant species.

TABLE 1

| Element | Lasing Valence State | Other Valence State |
|---|---|---|
| Ytterbium (Yb) | 3+ | 2+ |
| Cerium (Ce) | 3+ | 4+ |
| Praseodymium (Pr) | 3+ | 4+ |
| Neodymium (Nd) | 3+ | 2+ |
| Terbium (Tb) | 3+ | 4+ |
| Dysprosium (Dy) | 3+ | 2+ |
| Thulium (Tm) | 3+ | 2+ |
| Samarium (Sm) | 3+ | 2+ |
| Europium (Eu) | 3+ | 2+ |
| Uranium (U) | 3+ | 4+ |
| Vanadium (V) | 2+ | 3+ |
| Chromium (Cr) | 3+ | 4+, 2+ |
| Cobalt (Co) | 2+ | 3+ |
| Nickel (Ni) | 2+ | 3+ |
| Titanium (Ti) | 3+ | 2+, 4+ |
| Iron (Fe) | 2+ | 3+ |
| Manganese (Mn) | 5+ | 4+, 6+ |

For example, in the case of a Yb:YAG lasing medium, the trivalent $Yb^{3+}$ ions are initially homogeneously distributed within the host material YAG. The Yb:YAG laser medium can be purchased off-the-shelf from a crystal manufacturing company. By applying a heat process in the presence of water vapor, the concentration profile of the $Yb^{3+}$ ions can be reduced at the periphery or near the surface region of the lasing medium as compared to the concentration of $Yb^{3+}$ ions at the center, i.e., along the longitudinal axis of the lasing medium. During the heat process, a portion of the laser active ions $Yb^{3+}$ is converted into divalent ions $Yb^{2+}$. The divalent ions $Yb^{2+}$ are distributed within the laser material such that a concentration profile of the $Yb^{2+}$ ions is higher at the periphery of the medium than at the center, i.e., along a longitudinal axis of the medium.

The trivalent $Yb^{3+}$ ions are the laser active ions and absorb at the pump wavelength, while the divalent $Yb^{2+}$ ions do not substantially absorb at the pump wavelength and are not laser active. As a result, the pump radiation is not absorbed by the $Yb^{2+}$ ions located at the periphery of the medium and penetrate to excite the $Yb^{3+}$ located deeper within the medium. Consequently, a pump profile and hence the associated gain profile varies radially from the center of the medium to the periphery of the medium in accordance with the concentration profile of the $Yb^{3+}$ active lasing ions. Such a radial-dependent gain profile within the laser medium serves as an apodizing "soft aperture" when placed in a laser resonator. As a result, the output beam quality from such a resonator can be improved as compared to an identical resonator under the same pumping conditions with laser medium having a uniform or homogenous concentration of active lasing ions $Yb^{3+}$.

In one embodiment, in the case of Yb:YAG laser medium, the conversion of $Yb^{3+}$ to $Yb^{2+}$ is accomplished by converting neighboring oxygen ions $O^{2-}$ with a 2- charge in the host material YAG to hydroxyl ions $OH^-$ with a 1- charge in an atmosphere of water vapor at relatively high temperature between about 500° C. and about 1900° C. The conversions of the oxygen ions $O^{2-}$ to hydroxyl ions $OH^-$ causes charge compensation effect where the $Yb^{3+}$ ions are "forced" to convert to $Yb^{2+}$ ions in order to satisfy charge neutrality in the overall laser medium Yb:YAG.

In the presence of water during a high temperature treatment of oxide crystals, hydroxyl ions $OH^-$ are incorporated on the normal oxygen ions $O^{2-}$ sites in the YAG matrix. In the case of Yb:YAG laser medium, the following reactions occur during the heat treatment in an atmosphere of water vapor. The water vapor reacts with the oxygen $O^{2-}$ ions in the host material YAG to form the hydroxyl ion $OH^-$ in reaction (1). The conversion of the oxygen ions $O^{2-}$ to hydroxyl ions $OH^-$ in reaction (1) liberates electrons where the $Yb^{3+}$ ions convert to $Yb^{2+}$ in reaction (2).

$$H_2O+2Yb^{3+}+3O^{2-} \rightarrow 2OH^-+O^{2-}+2Yb^{3+}+\tfrac{1}{2}O_2+2e^- \quad (1)$$

$$2e^-+2Yb^{3+} \rightarrow 2Yb^{2+} \quad (2)$$

Using reactions (1) and (2), an overall reaction (3) can be written as follows:

$$H_2O+2Yb^{3+}+3O^{2-} \rightarrow 2OH^-+2Yb^{2+}+O^{2-}+\tfrac{1}{2}O_2 \quad (3)$$

The above reactions take place on the surface of the lasing medium Yb:YAG crystal. Initially the hydroxyl ions $OH^-$ are formed on the surface of the medium and are confined to this region. However, the hydroxyl ions $OH^-$ dissociate at high temperature to produce oxygen ions $O^{2-}$ and protons $H^+$, as shown in reaction (4).

$$2Yb^{2+}(s)+2OH^-(s) \rightarrow 2O^{2-}(s)+2H^++Yb^{3+}(s)+Yb^{2+}(s)+e^- \quad (4),$$

where (s) represents the surface of the medium.

The protons $H^+$ and electrons $e^-$ diffuse to neighboring or adjacent oxygen ion and $Yb^{3+}$ sites, respectively, deeper towards the center of the medium and react to produce new hydroxyl ions $OH^-$ and $Yb^{2+}$ ions deeper within the medium, as shown in reaction (5).

$$Yb^{3+}(c)+2O^{2-}(c)+2H^++e^- \rightarrow Yb^{2+}(c)+2OH^-(c) \quad (5),$$

where (c) represents the center of the medium.

This process of (i) proton formation, (ii) electron liberation, (iii) reaction with oxygen ions $O^{2-}$ to produce $OH^-$, and (iv) electron reduction of $Yb^{3+}$ ions to form $Yb^{2+}$ ions is repeated within the laser medium until the diffusion process is halted (for example, due to insufficient heat), or the protons cannot diffuse further within the laser medium (for example, due to insufficient heat). The diffusion process depends on the process temperature and the duration of heat exposure. The higher the process temperature, the faster the diffusion of protons and electrons towards the center of the laser medium, and the greater the concentration of hydroxyl ions $OH^-$ and $Yb^{2+}$ ions deeper within the laser medium for a given time period. Similarly, the longer the time duration the medium is exposed to heat, the greater the diffusion of protons and electrons towards the center of the laser medium, and the greater the concentration of hydroxyl ions $OH^-$ and $Yb^{2+}$ ions deeper within the laser medium. Both the diffusion mechanism and the diffusion rate can be enhanced by processing the laser medium at higher temperature, thus significantly decreasing the processing time while increasing the penetration of the $OH^-$ ions and thus the formation of $Yb^{2+}$ within the medium.

In the embodiment described above, the hydroxyl ions $OH^-$ are formed from water (see reaction 1 above). However, as it can be appreciated, hydroxyl ions $OH^-$ can be formed from other chemical substances such as alcohols (e.g., ethanol $C_2H_5OH$) or bases (e.g., NaOH, KOH), etc.

In one embodiment, instead of or in addition to heating the medium to high temperature, the medium can be subjected to a high voltage such that hydroxyl ions $OH^-$ or proton $H^+$ can be driven deeper within the medium. In this way, the process time can be further reduced.

By controlling or tailoring the time and/or temperature in the heat process, the radial profile of the different valence states can be controlled in a similar fashion to a normal impurity diffusion process, as governed by Fick's laws. The thermal diffusion of the protons and electrons follows Fick's first and second laws for impurity diffusion in a semi-infinite solid.

The process by which the trivalent ytterbium ions $Yb^{3+}$ near the periphery of lasing medium 10 are converted to the divalent state is believed to be governed by Fick's laws for impurity diffusion in a semi-infinite solid. The concentration $[OH^-]$ of hydroxyl ions $OH^-$ or the concentration $[Yb^{2+}]$ of $Yb^{2+}$ ions can be calculated using the following equation (6).

$$[OH^-] \text{ or } [Yb^{2+}] = 1 - \mathrm{erf}\left[\frac{x}{2(D \cdot t)^{1/2}}\right], \quad (6)$$

where x is the distance from the surface of the laser medium, D is the diffusion coefficient and t is the time from initial condition.

Since the total concentration of ytterbium ions is constant, the concentration of the trivalent ions can be calculated by $[Yb^{3+}]=1-[Yb^{2+}](x,t)$.

Diffusion coefficient D can be expressed by the following equation (7), where $D_0$ is the maximum diffusion constant at infinite temperature, $E_A$ is the activation energy, T is the temperature, and R is the gas constant.

$$D = D_0 \cdot e^{-\frac{E_A}{RT}} \quad (7)$$

Figure 2A:
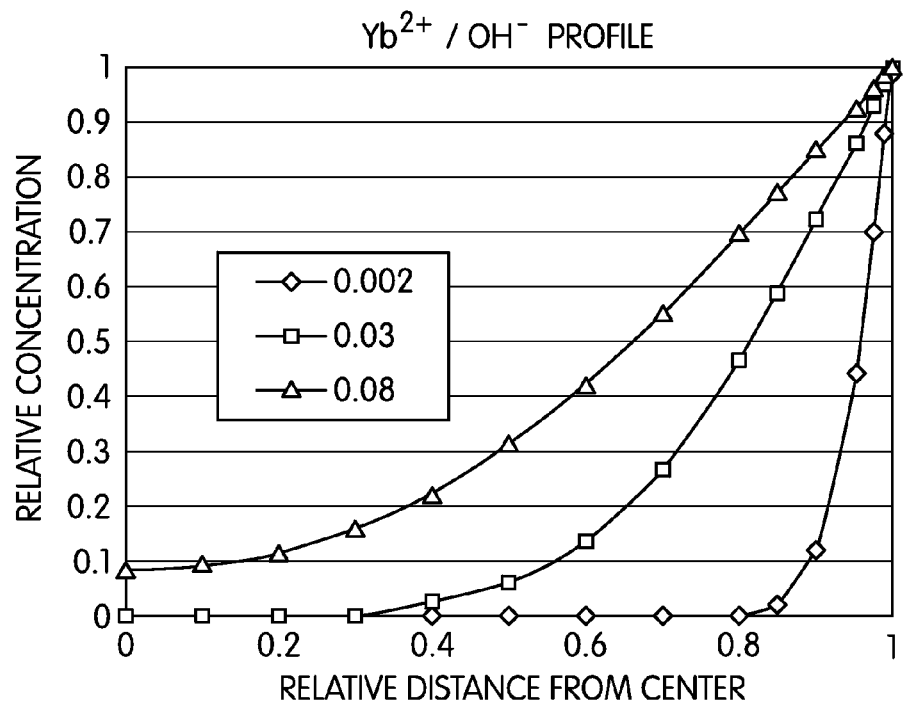
FIG. 2A is a graph showing approximate distribution of relative concentration of $Yb^{2+}$ ions in a Yb:YAG laser medium as a function of distance from the center of the laser medium at various products of diffusion constant by time, according to an embodiment.

FIG. 2A is a graph showing an approximate profile distribution of relative concentration of $Yb^{2+}$ ions or $OH^-$ ions in Yb:YAG laser medium as a function of radial distance r from the center of the laser medium at various products (D·t) of diffusion constant D by time t, according to an embodiment. As shown in FIG. 2A, the relative concentration of divalent $Yb^{2+}$ ions or $OH^-$ ions increases with increasing distance from the center of the medium. In addition as shown in FIG. 2A, an increase in parameter D·t, i.e., an increase in the diffusion constant (corresponding to an increase of temperature) and/or an increase in the time, results in the concentration profile of $Yb^{2+}/OH^-$ becoming less steep. Specifically, the divalent ions $Yb^{2+}$ concentration or $OH^-$ concentration decreases more slowly with decreasing relative distance from the center of the medium for increasing D·t parameter. This implies that with increasing D·t parameter, i.e., with increasing diffusion constant (corresponding to an increase in temperature) and/or with increasing time, the $OH^-$ ions diffuse further towards the center of the medium thus generating more divalent ions $Yb^{2+}$ towards the center of the medium.

Figure 2B:
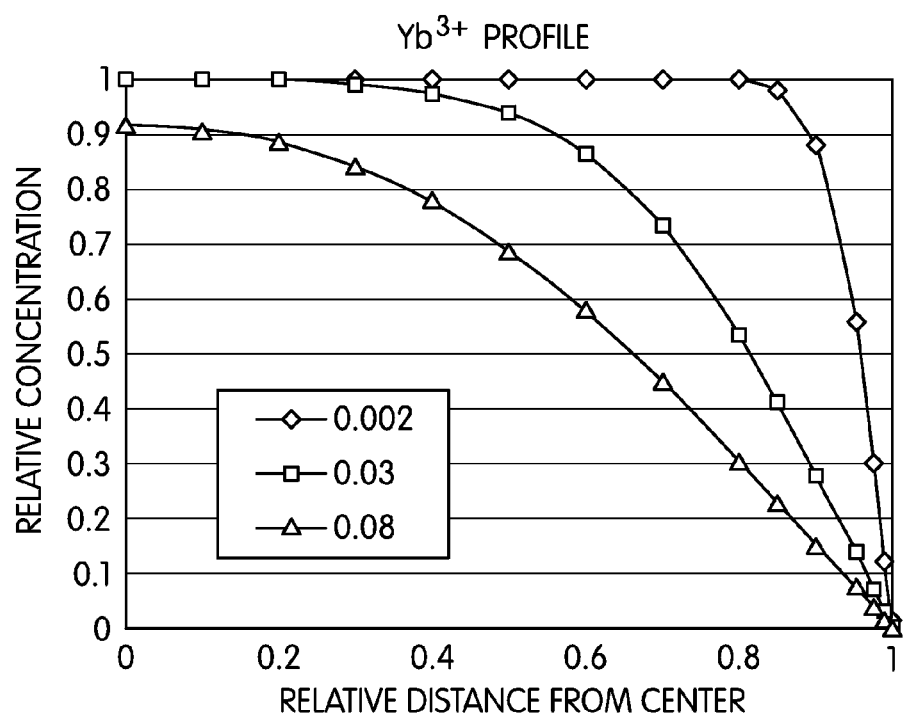
FIG. 2B is a graph showing approximate distribution of relative concentration of $Yb^{3+}$ ions in the Yb:YAG laser medium as a function of distance from the center of the laser medium at various products of diffusion constant by time, according to an embodiment.

FIG. 2B is a graph showing an approximate profile distribution of relative concentration of $Yb^{3+}$ ions in a Yb:YAG laser medium as a function of radial distance r from the center of the laser medium at various products (D·t) of diffusion constant D by time t, according to an embodiment. As shown in FIG. 2B, the relative concentration of trivalent $Yb^{3+}$ ions decreases with increasing distance from the center of the medium. In addition, as shown in FIG. 2B, an increase in parameter D·t, i.e., an increase in the diffusion constant (corresponding to an increase of temperature) and/or an increase in the time, results in the concentration profile of $Yb^{3+}$ becoming less steep. Specifically, the trivalent ions $Yb^{3+}$ concentration decreases more slowly with increasing relative distance from the center of the medium for increasing D·t parameter. This implies that with increasing D·t parameter, i.e., with increasing diffusion constant (corresponding to an increase of temperature) and/or with increasing time, the $OH^-$ ions diffuse further towards the center of the medium thus generating more divalent ions $Yb^{2+}$ towards the center of the medium by converting more trivalent ions $Yb^{3+}$ and thus reducing the concentration of $Yb^{3+}$.

Hence, a tailored concentration profile of the laser active ions $Yb^{3+}$ with a maximum around the center of the laser medium can be created by controlling the heat treatment process of the laser medium. The concentration profile of active ions $Yb^{3+}$ allows maximizing of the pump absorption and gain profiles along the longitudinal axis of the medium, and minimizing of absorption of the pump towards the peripheral surface of the laser medium. As a result, the medium acts as a "soft apodizing aperture" within a laser resonator and serves to discriminate against higher order resonator transverse electromagnetic modes to provide lower transverse electromagnetic mode operation of the laser (e.g., provide fundamental transverse electromagnetic mode operation of the laser). In this way, the output beam quality can be improved.

Figure 3:
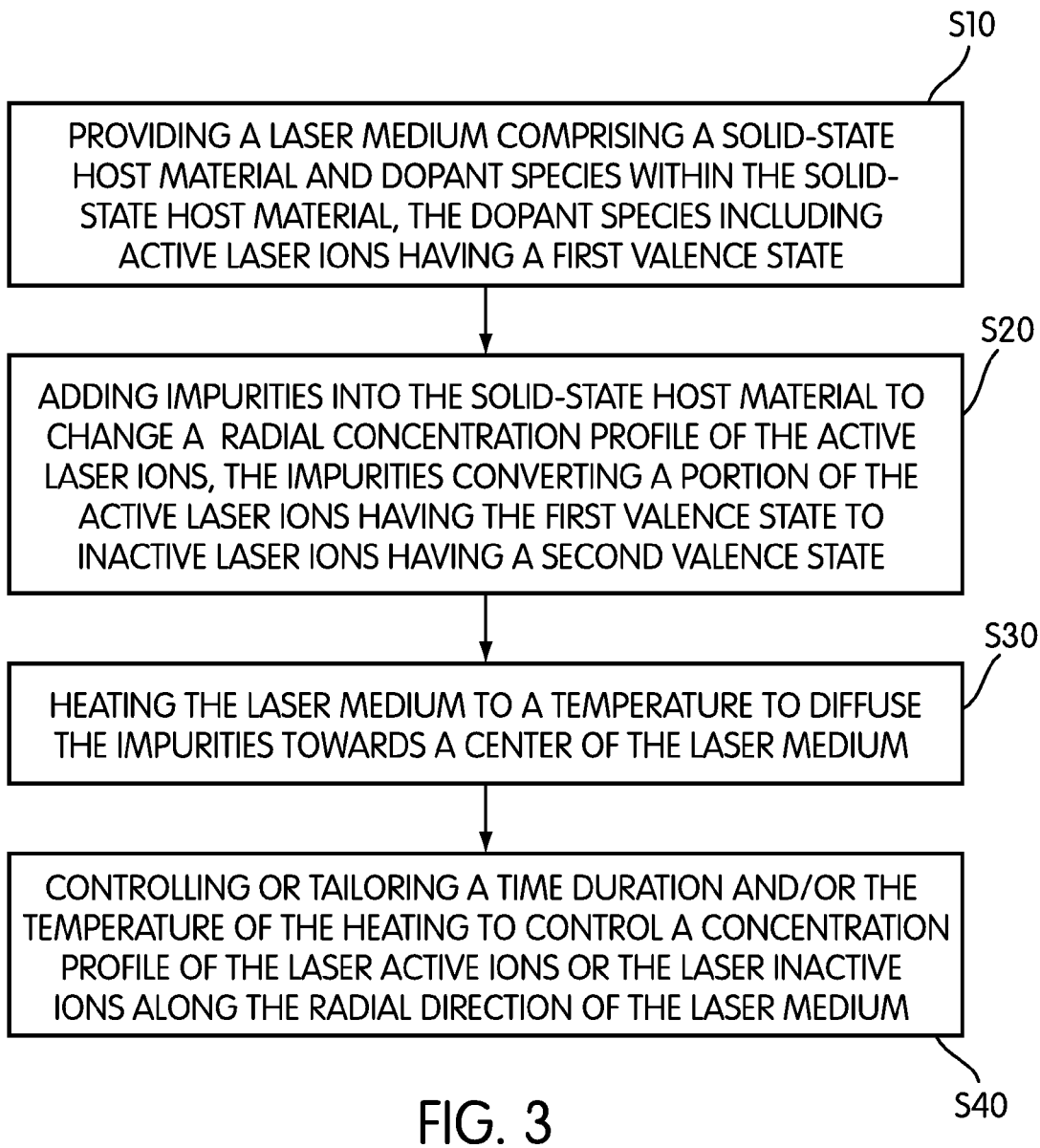
FIG. 3 is a flow chart of a method of manufacturing the laser medium, according to an embodiment.

Therefore, it can be appreciated from the above description that one embodiment provides a method of manufacturing a laser medium with controlled concentration profile of active laser ions. FIG. 3 is flow chart of the method of manufacturing the laser medium, according to an embodiment. The method comprises providing a laser medium comprising a solid-state host material and dopant species within the solid-state host material, the dopant species including active laser ions having a first valence state, at S10, and adding impurities into the solid-state host material of the laser medium to change a radial concentration profile of the active laser ions within the solid-state host material, S20. The impurities convert a portion of the active laser ions having the first valence state to inactive laser ions having a second valence state. In one embodiment, adding impurities at S10 comprises adding hydroxyl ions $OH^-$ into the solid-state host material. In one embodiment, the method includes heating the laser medium to a temperature to diffuse the impurities towards a center of the laser medium, at S30. In one embodiment, the method further includes controlling or tailoring the time duration and/or temperature of the heating process to control a concentration profile the laser active ions or the laser inactive ions along a radial direction of the laser medium, at S40.

Figure 4:
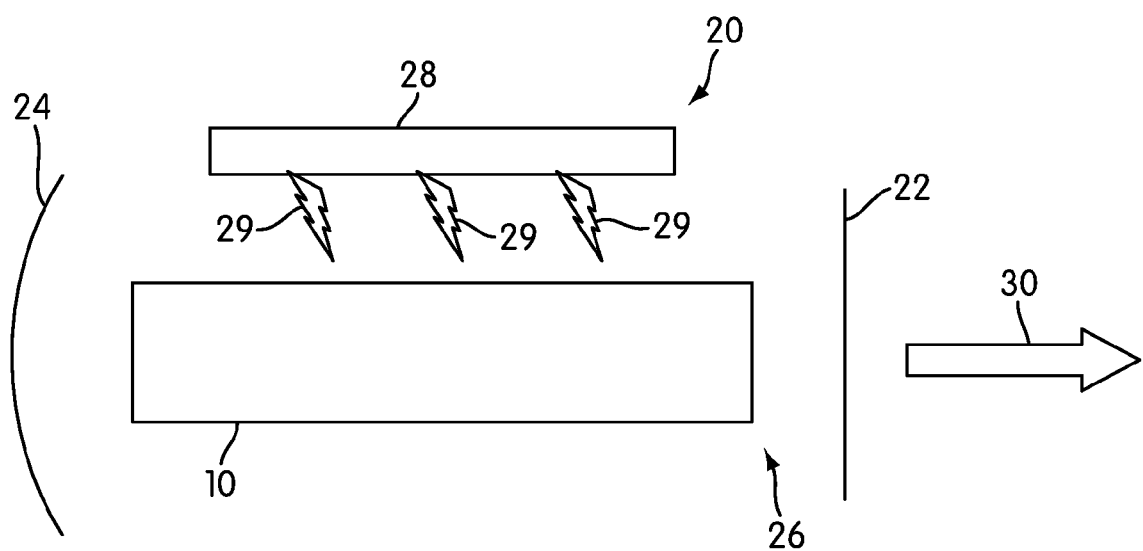
FIG. 4 is a schematic diagram of a laser comprising the laser medium shown in FIG. 1.

As it can be further appreciated from the above description, one embodiment provides a laser 20 comprising the above laser medium 10. FIG. 4 is a schematic diagram of the laser 20 comprising laser medium 10. Laser medium 10 is disposed between two mirrors 22 and 24. One of the two mirrors 22, 24 is 100% reflective while the other is partially transparent. The partially transparent mirror (for example, mirror 22) is the output coupler. The two mirrors 22 and 24 form an optical cavity or an optical resonator 26. Gain medium or laser medium 10 is disposed in optical cavity 26. Pump source 28 which can produce energy in the form of optical energy such as a flash of radiation 29 is provided to induce a population inversion in laser medium 10. Radiation of a specific wavelength that passes through gain medium or laser medium 10 is amplified and mirrors 22 and 24 are aligned such that most of the radiation emitted by gain medium 10 makes multiple passes within optical cavity 28 through gain medium 10. A portion of the radiation amplified by laser medium 10 is output through the output coupler (for example, mirror 22) as laser beam 30. Although, laser medium 10 is depicted being disposed in laser cavity 26 formed by two mirrors 22 and 24, as it can be appreciated, laser medium 10 can also be disposed in a laser ring cavity having more than two mirrors (e.g., three or four mirrors). Furthermore, although mirrors 22 and 24 are depicted in FIG. 4 having, respectively, plane and spherical shapes (i.e., forming a hemispherical cavity), it can be appreciated that mirrors 22 and 24 can have other shapes to form other cavity configurations such as a confocal cavity, a plane-parallel cavity, a concentric cavity, a concave-convex cavity, etc.

Although the inventive concept has been described in detail for the purpose of illustration based on various embodiments, it is to be understood that such detail is solely for that purpose, and that the inventive concept is not limited to the disclosed embodiments, but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment.

Furthermore, since numerous modifications and changes will readily occur to those with skill in the art, it is not desired to limit the inventive concept to the exact construction and operation described herein. Accordingly, all suitable modifications and equivalents should be considered as falling within the spirit and scope of the present disclosure.

What we claim is:

1. A method of manufacturing a laser medium with controlled concentration profile of active laser ions, comprising:
    providing a laser medium comprising a solid-state host material and dopant species within the solid-state host material, the dopant species including active laser ions having a first valence state; and
    adding negatively charged ion impurities into the solid-state host material of the laser medium to change a concentration profile of the active laser ions within the solid-state host material along a radial direction of the laser medium;

wherein the impurities convert a portion of the active laser ions having the first valence state to inactive laser ions having a second valence state.

2. The method of claim 1, wherein said adding the impurities comprises adding hydroxyl ions OH⁻ into the solid-state host material.

3. The method of claim 1, wherein the active laser ions comprise ytterbium ions $Yb^{3+}$ and the inactive laser ions comprise ytterbium ions $Yb^{2+}$.

4. The method of claim 3, wherein said converting the portion of the active laser ions having the first valence state to inactive laser ions having the second valence state comprises converting a portion of laser active ions $Yb^{3+}$ into laser inactive ions $Yb^{2+}$.

5. The method of claim 4, wherein said converting the portion of laser active ions $Yb^{3+}$ ions into laser inactive ions $Yb^{2+}$ ions comprises converting neighboring negatively double charged oxygen ions $O^{2-}$ in the solid-state host material to hydroxyl ions $OH^-$.

6. The method of claim 5, wherein said converting the neighboring negatively double charged oxygen ions $O^{2-}$ in the solid-state host material to hydroxyl ions $OH^-$ comprises heating the laser medium, and forming the hydroxyl ions $OH^-$ in an atmosphere of water vapor at a temperature between about 500° C. and about 1900° C.

7. The method of claim 1, further comprising heating the laser medium to a temperature to diffuse the impurities towards a center of the laser medium.

8. The method of claim 7, further comprising controlling a time duration or the temperature, or both of the heating to control a concentration profile of the laser active ions or the laser inactive ions along the radial direction of the laser medium.

9. The method of claim 8, wherein said controlling the concentration profile comprises:
decreasing a concentration of the active laser ions having the first valence state radially with increasing distance from the center of the laser medium, and
increasing a concentration of the inactive laser ions having the second valence state radially with increasing distance from the center of the laser medium.

10. A laser medium comprising:
a solid-state host material; and
dopant species provided within the solid-state host material,
a first portion of the dopant species having a first valence state, and a second portion of the dopant species having a second valence state, wherein a concentration of the first portion of the dopant species decreases radially with increasing distance from a center of the medium, and a concentration of the second portion of the dopant species increases radially with increasing distance from the center of the medium; and
impurities within the solid-state host material, the impurities converting the first portion of the dopant species having the first valence state into the second portion of dopant species having the second valence state,
wherein the impurities comprise negatively charged ion impurities.

11. The laser medium of claim 10, wherein the impurities comprise hydroxyl ions $OH^-$.

12. The laser medium of claim 10, wherein substantially all the dopant species are in the second valence state at a periphery of the solid-state host material and all the dopant species are in the first valence state around a longitudinal axis of the of the solid-state host material.

13. The laser medium of claim 10, wherein the first portion of dopant species having the first valence state are laser active and absorb at a pump wavelength and the second portion of the dopant species having the second valence state do not substantially absorb at the pump wavelength and are laser inactive.

14. The laser medium of claim 10, wherein the solid-state host material is selected from the group consisting of yttrium aluminum garnet, yttrium lithium fluoride, yttrium vanadate, yttrium orthosilicate, and sapphire.

15. The laser medium of claim 10, wherein the dopant species comprise ytterbium, erbium, cerium, praseodymium, neodymium, terbium, dysprosium, thulium, samarium, europium, uranium, vanadium, chromium, cobalt, nickel, titanium, iron, manganese, or any combination of two or more thereof.

16. The laser medium of claim 10, wherein the solid-state host material comprises yttrium aluminum garnet and the dopant species comprise ytterbium (Yb).

17. The laser medium of claim 16, wherein the first portion of the dopant species having the first valence state comprise $Yb^{3+}$ ions, and the second portion of the dopant species having the second valence state comprise $Yb^{2+}$ ions, and wherein a portion of $Yb^{3+}$ ions are converted into $Yb^{2+}$ ions by converting neighboring negatively double charged oxygen ions $O^{2-}$ in the solid-state host material to hydroxyl ions $OH^-$.

18. The laser medium of claim 10, wherein, in operation, the laser medium discriminates against higher order transverse electromagnetic modes to provide lower transverse electromagnetic mode laser operation.

19. A laser comprising:
at least two laser mirrors; and
a solid-state host material disposed between the at least two laser minors;
wherein the solid-state host material comprises dopant species, a first portion of the dopant species having a first valence state, and a second portion of the dopant species having a second valence state,
wherein a concentration of the first portion of the dopant species decreases radially with increasing distance from a center of the medium, and a concentration of the second portion of the dopant species increases radially with increasing distance from the center of the medium; and
wherein the solid-state host material further comprises negatively charged ion impurities, the impurities converting the first portion of the dopant species having the first valence state into the second portion of dopant species having the second valence state.

20. The laser of claim 19, wherein the laser operates in lower transverse electromagnetic modes.

21. The laser of claim 20, wherein the laser operates in a fundamental electromagnetic mode.

* * * * *